(12) United States Patent
Day

(10) Patent No.: US 7,734,193 B2
(45) Date of Patent: Jun. 8, 2010

(54) LEVEL DETECTOR FOR OPTICAL RECEIVERS

(75) Inventor: Chris J. Day, Santa Rosa, CA (US)

(73) Assignee: Tri Quint Semiconductor, Inc., Hillsboro, OR (US)

(*) Notice: Subject to any disclaimer, the term of this patent is extended or adjusted under 35 U.S.C. 154(b) by 813 days.

(21) Appl. No.: 11/200,577

(22) Filed: Aug. 10, 2005

(65) Prior Publication Data

US 2006/0034619 A1 Feb. 16, 2006

Related U.S. Application Data

(60) Provisional application No. 60/601,018, filed on Aug. 12, 2004.

(51) Int. Cl.
    *H04B 10/06* (2006.01)
(52) U.S. Cl. ............... 398/202; 398/208; 398/209; 398/210; 398/211; 398/212; 398/213; 455/341; 455/334
(58) Field of Classification Search ......... 398/202–214; 330/308; 375/318; 359/189
    See application file for complete search history.

(56) References Cited

U.S. PATENT DOCUMENTS

| | | | |
|---|---|---|---|
| 4,139,767 A | 2/1979 | Witkowicz | |
| 4,998,012 A | 3/1991 | Kruse | |
| 5,013,903 A | 5/1991 | Kasper | |
| 5,095,286 A | 3/1992 | Cole et al. | |
| 5,239,402 A | 8/1993 | Little, Jr. et al. | |
| 5,267,071 A | 11/1993 | Little et al. | |
| 5,347,389 A | 9/1994 | Skrobko | |
| 5,430,765 A * | 7/1995 | Nagahori | 375/318 |
| 6,084,478 A * | 7/2000 | Mayampurath | 330/308 |
| 6,242,732 B1 | 6/2001 | Rantakari | |
| 6,297,701 B1 * | 10/2001 | Visocchi et al. | 330/308 |
| 6,587,004 B2 | 7/2003 | Ide | |
| 6,674,967 B2 | 1/2004 | Skrobko | |
| 7,109,793 B2 * | 9/2006 | Nakatani et al. | 330/252 |

(Continued)

FOREIGN PATENT DOCUMENTS

JP 6-224652 8/1994

(Continued)

OTHER PUBLICATIONS

Schild et al: "High-Gain SiGe Transimpedance Amplifier Array for a 12 x 10 Gb/s Parallel Optical-Fiber Link", IEEE Journal of Solid-State Circuits, vol. 38, No. 1, Jan. 2003, pp. 4-12.*

(Continued)

*Primary Examiner*—Li Liu
(74) *Attorney, Agent, or Firm*—Reed Smith LLP

(57) ABSTRACT

An apparatus and method for detecting an output power level of an optical receiver, in order to hold output signal levels constant over changing input optical levels. A photodetector detects an optical signal, and a current from the photodetector is applied an amplifier. The amplifier may be either a differential trans-impedance amplifier, or a dual trans-impedance amplifier coupled to a differential output amplifier. An output of the amplifier is applied o a signal detector, wherein an output signal of the signal detector is an indication of an output power level of the optical receiver.

10 Claims, 7 Drawing Sheets

U.S. PATENT DOCUMENTS

2002/0135845 A1 * 9/2002 Robinson et al. ............ 359/189
2004/0044489 A1   3/2004 Jones et al.

FOREIGN PATENT DOCUMENTS

JP        06-224652    *  8/1994
WO    WO 00/11780         3/2000
WO    WO 00/35081         6/2000

OTHER PUBLICATIONS

Childs, et al., "AM Video Distribution System with a 64-Way Passive Optical Splitting", IEEE Photonics Technology Letters, vol. 4, No. 1, Jan. 1992.

Zand, et al, "Trans-impedance Amplifier with Differential Photodiode Current Sensing", Proceedings of the 1999 IEEE International Symposium of Circuits and Systems.

European Search Report.

* cited by examiner

LEVEL DETECTOR FOR OPTICAL RECEIVERS

This application claims the benefit of U.S. Provisional Application No. 60/601,018, filed Aug. 12, 2004, entitled OPTICAL RECEIVERS AND AMPLIFIERS FOR LINEAR BROADBAND DISTRIBUTION SYSTEMS, the disclosure of which is herein incorporated by reference.

BACKGROUND OF THE INVENTION

1. Field of the Invention

The present invention relates generally to circuits for optical receivers, and more particularly to a level detector and automatic gain control for optical receivers.

2. Description of the Related Art

The delivery of video services over communication systems such as Hybrid-Fiber-Coax (HFC), Fiber-To-The-Curb (FTTC), and Fiber-To-The-Home (FTTH) often necessitates the use of high dynamic range technologies to support legacy analog NTSC signal formats. These video systems all use amplitude modulated (AM) optical carriers and require an optical transmitter to modulate the information onto the light. They also require an optical receiver to demodulate and amplify the signal for use by customer premise terminals, such as set top boxes or NTSC television sets.

A basic optical link used in an analog RF video delivery system is shown in FIG. 1. In this case, an FTTP analog RF system is shown, but the principles are equally applicable to HFC or FTTC systems. An optical transmitter takes in a multi-channel signal and amplitude modulates (AM) a light source in a linear fashion. The content can be standard NTSC analog TV channels or digitally modulated carriers such as used in cable modem systems. This system is primarily designed to carry video services, but quite often is used to carry advanced digital services such as high-speed data and telephony. The output of the optical transmitter provides an input to an Erbium Doped Fiber Amplifier (EDFA), which greatly increases optical power levels without adding significant noise or distortion. The EDFA high power output is then fanned out by means of an optical splitter to provide signal to a number of customers. Typically the fan-out or split ratio is 1:32 or 1:64. The amplitude-modulated optical signal is then demodulated into an electrical signal by a photo-detector, which functions as an envelope detector on the incoming light. A trans-impedance amplifier provides electrical gain such that the resulting signal is suitable for distribution to customer premise equipment, or to further coaxial distribution systems.

Because of the spatial diversity of customers and the variable nature of optical link budgets in typical deployments, optical path losses can widely vary. For instance, fiber runs will be longer in rural areas than in urban environments. Depending on the specific optical plant deployed, the number and locations of loss elements such as patch panels and splices will vary. To make wide-scale deployments over a large range of optical plants easier it is very desirable to have an optical receiver able to operate over a wide optical dynamic range. For instance, in some three-wavelength FTTP systems now in the early stages of deployment, the desired optical loss budget is between 10 to 28 dB. Unfortunately, optical receivers for 1550 nm wavelength video portions of the FTTP system only support about 7 or 8 dB of dynamic range. The small optical dynamic range of video optical receivers can make FTTP deployments more difficult since more effort must be expended to meet the relatively narrow optical input window. A wider 1550 nm wavelength video receiver dynamic range will make FTTP deployments easier.

To minimize cost of installation and maintenance, service providers often desire the RF output of their optical receivers to be held to a constant level over the optical dynamic range. As the input optical condition changes, it is desirable that the RF output level does not change such that the input level to RF equipment (such as television sets or set-top-boxes) is constant. To accomplish this, optical receivers often include capability for adjusting the RF output level using automatic gain control (AGC) circuitry.

A common technique for doing this is shown in FIG. 2. The output of the trans-impedance amplifier is sent to a variable attenuator whose loss characteristics are adjustable with a control signal. A variable gain circuit may also be used in place of the variable attenuator. The output of the variable attenuator feeds a direction coupler which couples a small portion of the signal leaving the receiver to a signal detection circuit. The output of the directional coupler then goes to the RF distribution network which often consists of coaxial cable, splitters, and terminal devices. The signal detector circuit senses how much energy is leaving the receiver and feeds a signal to an AGC circuit which contains a servo-mechanism for adjusting the variable attenuator. Should for any reason the output of the level detector be low relative to a reference inside the AGC control block, the AGC control block will reduce the amount of attenuation in the RF path, thereby increasing the RF output.

In this way, the AGC control block continuously adjusts the variable attenuator such that the RF output level is held constant over a wide range of anticipated variations. Known variations include changes in the depth of optical modulation index (OMI) on the incoming light, changes in input optical power level, variations in photo-detector responsivity, and changes in trans-impedance gain. These quantities can all vary with time, temperature, and from unit to unit, so the ability to automatically adjust receiver characteristics is very desirable.

It is important to note the directional nature of the coupler. Signal reflections from the RF distribution network should not be allowed to reach the signal detector, as would be the case if the directional coupler had poor ability to separate forward going signals from reverse ones. In the case of FTTP networks, the poor control over the impedance of RF distribution networks in homes requires good directional characteristics to insure proper output levels are launched from the receiver.

The problems with the AGC approach in FIG. 2 are cost and complexity. Broadband directional devices are often wound with multiple turns of fine wire around ferrite cores with small openings, which is a labor-intensive process. Eliminating the need for ferrite wound devices in the AGC circuit will lead to a direct cost reduction. Broadband couplers also introduce loss into the receiver output. Loss-loss directional couplers are possible but at the expense of the amount of coupling provided to the signal detector.

For best signal detector performance, it is desirable to have higher levels of signal incident on the detection device in the level detector block. Without adequate RF drive, level detectors will output correspondingly low levels of voltage that in turn makes it necessary to use expensive op-amps with higher levels of precision performance, such as offset voltage, in the AGC block. To alleviate this problem, RF post amplifiers are often used between the directional coupler's coupled port output and the signal detector input. This approach adds cost, however.

Optical receivers often perform output level control by sensing the input light condition, as done in Skrobko, U.S. Pat. No. 6,674,967, which is commonly known in the industry as "optical AGC". Here, the amount of DC current drawn by the photo-detector is proportional to the amount of optical power hitting the receiver. This information may be used to adjust the output level of the receiver. When the input power is high, the receiver gain may be adjusted an amount that will hold the output level constant. When the amount of light is low, the receiver gain may be adjusted upward an appropriate amount to hold the output level constant. The drawback of this approach is it is an open loop implementation. There is no ability to adjust for variations in input light OMI or variations of the gain of the receiver.

Even in optical AGC approaches, it is often sometime desirable to have an indication of the amount of signal leaving the receiver. In those cases, a direction level detector is desirable even if the output of the level detector is not used in the adjustment of gain.

The frequency response of the trans-impedance amplifier (TIA) section of the receiver shown in FIG. 2 is in large part determined by the pole formed by the photo-detector junction capacitance appearing across the cathode and anode nodes, and the effective input impedance of the TIA. As noted in the prior art discussion of Cole, et al, U.S. Pat. No. 5,095,286, shunt feedback from output to input creates a trans-impedance amplifier and is effective in minimizing the effects of photo-detector capacitance and providing a wide bandwidth. As described in the discussion in Kruse, U.S. Pat. No. 4,998,012, proper selection of the value of shunt feedback inside the trans-impedance amplifier can result in satisfactory noise and distortion performance. In Cole, et al, U.S. Pat. No. 5,095,286, power gain of the receiver is determined by the ratio of input impedance to output impedance as seen by the amplifier, thus the frequency response and gain characteristics are largely determined by the large source impedances, on the order of 500 ohms, appearing at each photo-detector terminal. Trans-impedance amplifiers using shunt feedback will generally use values of feedback resistances of between 300 and 1000 ohms, which provides excellent low input impedance due to the negative feedback action, and excellent noise from the low amount of thermal noise from the resistors. Historically, these benefits have lead most designers to use shunt feedback in their trans-impedance amplifier designs.

SUMMARY OF THE INVENTION

According to the present invention, a circuit and method are disclosed for detecting an output power level of an optical receiver. In one embodiment, the detector circuit comprises a a photodetector having an anode and a cathode, an amplifier having at least two inputs and two outputs, wherein one input is connected to the photodetector anode, and a second input is connected to the photodetector cathode, and a signal detector connected to one output of the amplifier, wherein the outputs of the amplifier are isolated from each other.

The amplifier may comprise either a single differential trans-impedance amplifier, or a dual trans-impedance amplifier coupled to a differential output amplifier. The signal detector detects t a signal strength of a signal originally leaving the circuit.

One embodiment of a method for detecting an output signal strength comprises detecting an optical signal with a photodetector, the photodetector generating a first current and a second current, applying the first current to one input of an amplifier, applying the second current to a second input of an amplifier, applying an output of the amplifier to a signal detector, wherein an output signal of the signal detector is an indication of an output power level of the optical receiver.

The amplifier may comprise either a single differential trans-impedance amplifier, or a dual trans-impedance amplifier coupled to a differential output amplifier.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

Figure 1:
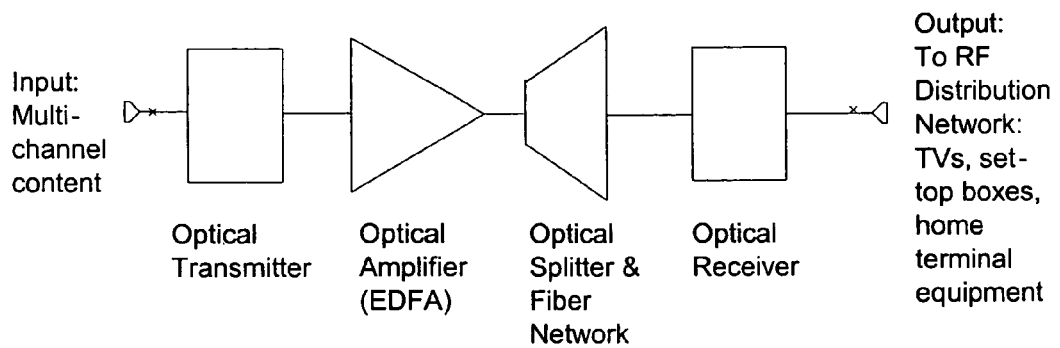
FIG. 1 is a block diagram of a standard optical link system.
Figure 2:
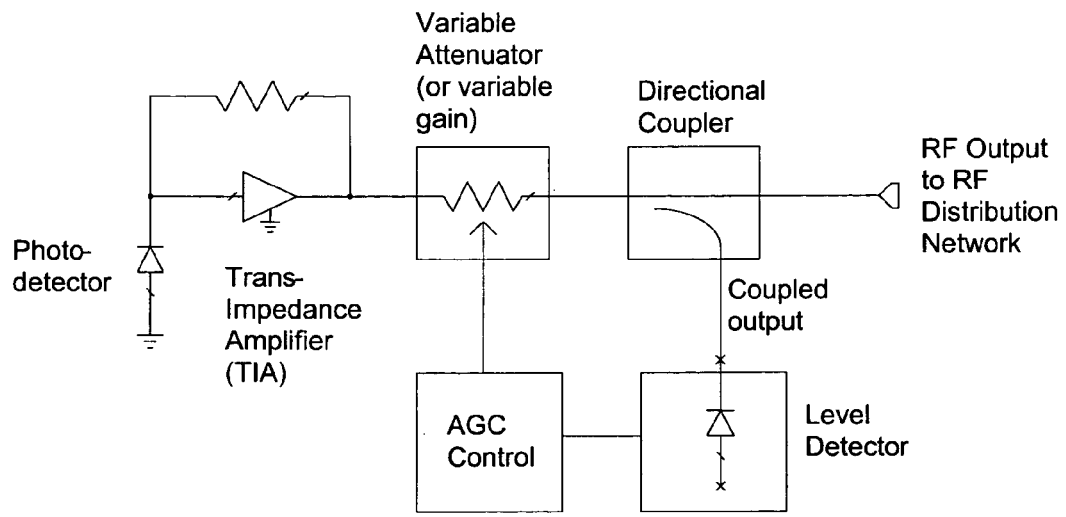
FIG. 2 is a block diagram of an automatic gain control system using variable attenuator, according to the prior art.

As mentioned above, the ability of the optical receiver to hold output signal levels constant over changing input optical levels helps operators save on installation and maintenance costs. One method for performing this automatic gain control (AGC) is shown in FIG. 2, where a key element is the ability to directionally detect the power leaving the receiver. A detector with directional properties is needed to perform this function.

Figure 3:
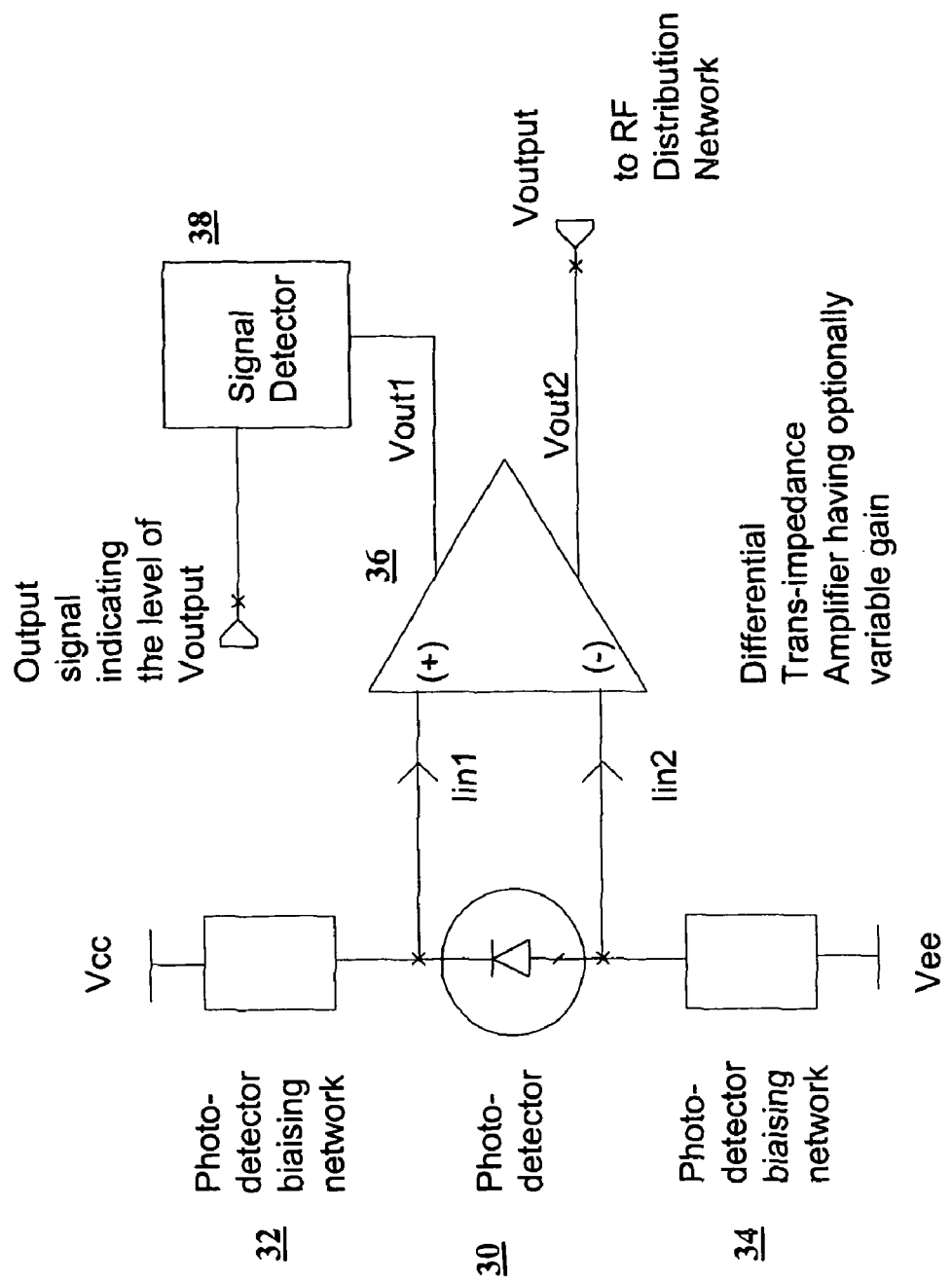
FIG. 3 is block diagram of one embodiment of the present invention.

An improved system and method for performing this directional detection is shown in FIG. 3. A photo-detector 32 is used to drive two inputs of a differential trans-impedance amplifier 34. The differential trans-impedance amplifier 34 produces two outputs which are each the result of the difference of input currents into the non-inverting (+) and inverting (−) terminals shown in FIG. 3. One output, Vout1, is fed to a signal detector 36, which detects a signal strength of a signal originally leaving the circuit (i.e. not signals re-reflected by the output impedance of the circuit). Mathematically one can write:

$$Vout1 = Z1*(Iin1 - Iin2) + \text{distortion terms}$$

$$Vout2 = Z2*(Iin2 - Iin1) + \text{distortion terms}$$

Where Iin1 and Iin2 are the input currents for the non-inverting (+) and inverting (−) inputs, respectively, and Z1 and Z2 are the linear coefficients of trans-impedance gain. Because the outputs Vout1 and Vout2 of this differential trans-impedance amplifier are dependent only on the difference of currents entering its inverting and non-inverting terminals, and not the opposite output voltage, there is implied directivity and isolation between the outputs. A change in loading conditions on one of the outputs does not alter the level of the other side's output. If the impedance presented to Vout2 varies with time, the amount of signal at the opposite output Vout1 does not change. Likewise, an externally induced signal on one of the outputs Vout1 or Vout2 will not show up at the other.

The benefit of the present invention is that a costly directional coupler has been eliminated. These directional devices are often labor intensive to wind and waste output power. Such a broadband directional device can be very difficult to fabricate on an RFIC, so its elimination can help enable a higher level of integration of the receiver. Eliminating the directional coupler also saves significant board space in what is very often a crowded component environment.

Figure 4:
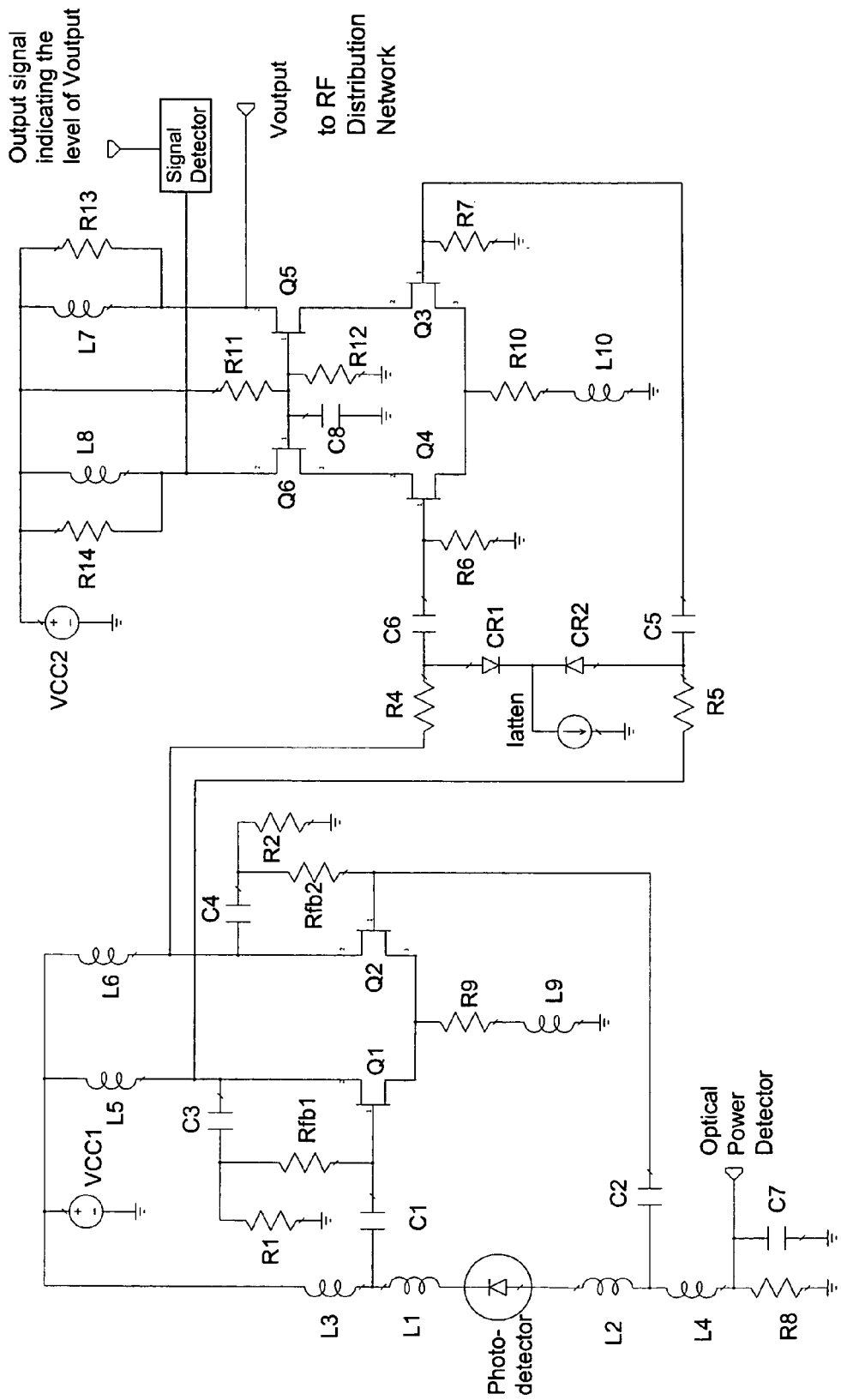
FIG. 4 is a schematic diagram showing one embodiment of the block diagram of FIG. 3.

The present technique also provides for excellent $2^{nd}$ order distortion performance by virtue of its balanced operation as shown in FIG. 4. The photo-detector current enters the input stage of the differential trans-impedance amplifier through peaking inductors L1 and L2. These inductors help control the gain flatness of the receiver, and are used to compensate parasitic photo-detector capacitances. The photo-detector biasing is accomplished through inductors L3 and L4, which enable the photo-detector to be reverse biased by an amount approximately equal to VCC1. A suitable photo-detector for this purpose is manufactured by Emcore, part number 2610.

As light power is incident on the photo-detector, a DC current flows from the cathode to anode of the photo-detector, which gives rise to a small DC voltage across R8. The amount of voltage across R8 indicates the amount of incoming light. The present invention may use field-effect-transistors (FETs) for active devices, which provide reasonable trans-conductance to very high frequencies while maintaining low intrinsic gate-to-source (Cgs) and drain-to-gate (Cdg) capacitances and very high input impedance. The embodiment in FIG. 4 uses Pseudomorphic-High-Electron-Mobililty-Transistors (PHEMTs) fabricated onto a single radio-frequency-integrated-circuit (RFIC) in a 0.25 micron device process. Alternate device technologies are also possible, such as Complementary Metal-Oxide-Semiconductor (CMOS) FETs, or Bipolar-Junction-Transistors (BJTs) such as Silicon-Germanium (SiGe) or GaAs Heterojunction-Bipolar-Transistors (HBTs).

The differential trans-impedance amplifier is a two-stage design based on two differential pairs, one formed by the Q1 and Q2 pair, and the other formed by the Q3 and Q4 pair. In the differential pair under normal operation, each half operates out of phase with respect to the opposite half. As Q1 conducts more current giving rise to a drop in its drain voltage, Q2 will be conducting less current giving rise to an increase in its drain voltage. Because both the cathode and anode of the photo-detector are used to drive the input stage, the input current to the invention is inherently balanced; each half of the invention in FIG. 4 receives the same magnitude but opposite phase of current. One of the beneficial properties of a differential pair is that in the case of a balanced input condition, each output is an odd function with respect to the input. Odd functions are those whose decomposition in a power series expansion contains only odd power terms, such as 1,3,5,7, . . . etc, which means there are no even order terms. Hence, the outputs taken from the drains of Q1 and Q2, and from the drains of Q5 and Q6, are each in and of themselves absent of $2^{nd}$ order distortion.

The input stage in FIG. 4 comprised of the Q1 with Q2 differential pair provides the primary trans-impedance of the receiver, while the output stage comprised of the Q3 with Q4 differential pair provides basic voltage gain which increases the net trans-impedance of the receiver. The input stage trans-impedance is largely determined by the shunt feedback resistors Rfb1 and Rfb2. Because the input impedance to Q1 and Q2 is very large, input current from the photo-detector primarily flows through the feedback resistors. The value of Rfb1 and Rfb2 are also the main determinants in overall equivalent input noise (EIN) of the receiver, and should be maximized as much as possible without harming the gain response or distortion performance of the receiver.

The outputs off the drains of Q1 and Q2 feed resistors R4 and R5 followed by CR1 and CR2, which are PIN diodes. These diodes have the property that their dynamic resistance varies with the DC current biased through them. Suitable PIN diodes are manufactured by Agilent Technologies, part number HSMP-381F. Biasing of the PIN diodes is accomplished by a variable DC current source, Iatten. As Iatten increases, the DC current in the PIN diodes CR1 and CR2 increases, which leads to a lower RF resistance and a larger voltage drop across R4 and R5. In other words, because the output stage formed by Q3 with Q4 has very high input impedance, a smaller dynamic resistance in the PIN diodes CR1 and CR2 causes more attenuation by the series resistors R4 and R5. Thus, Iatten controls the amount of attenuation that occurs between the input trans-impedance stage and the output post amp stage. Iatten is then the primary mechanism for adjusting the net gain of the differential trans-impedance amplifier.

The attenuated signal traverses through decoupling capacitors C6 and C5 and into the output stage formed by the Q3 with Q4 differential pair. A cascode topology is formed by adding Q6 and Q5 to the drains of Q4 and Q3 respectively. The cascode topology has a number of favorable attributes as an output amplifier, such as improved frequency response, higher gain, and improved linearity. Most importantly in the present invention, the cascode topology provides excellent isolation between the outputs at the drains of Q6 and Q5 respectively, and the inputs at the gates of Q4 and Q3. This isolation helps the output stage maintain balance.

Figure 6:
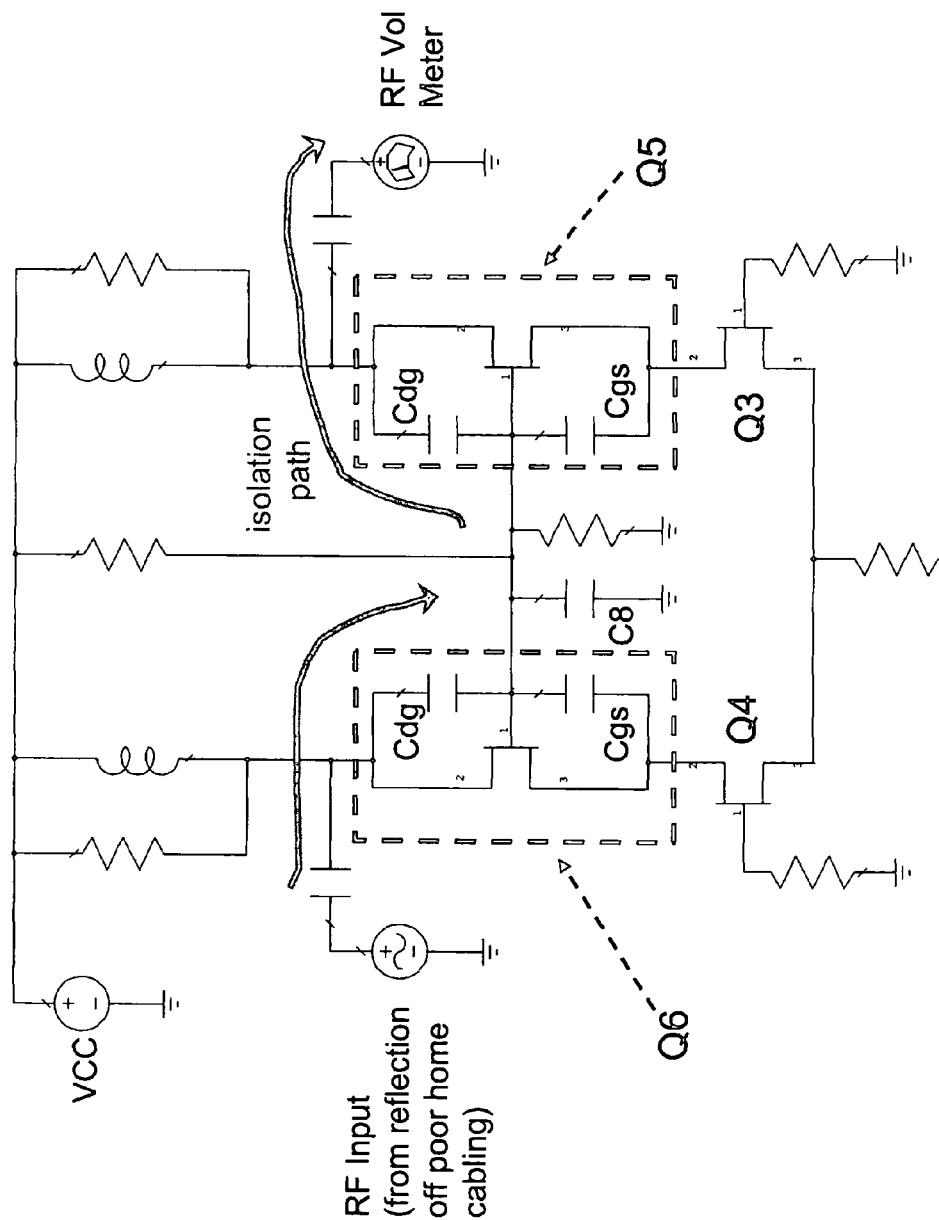
FIG. 6 is a schematic diagram showing the major parasitic capacitances of the top devices in the cascode stage of FIG. 4.

The high isolation between the outputs in the invention can be seen by examining FIG. 6, where the output section of FIG. 4 has been redrawn showing the major parasitic capacitances of the top devices in the cascode stage, Q5 and Q6. In order to consider the isolation between the drains, an RF test source can be viewed as sending an RF voltage into the drain of Q6. This RF test source mimics a reflected signal off the RF distribution network, such as from in-home RF coaxial cables. The isolation of the circuit is the ratio of how much RF voltage appears at the RF volt meter located on the opposite drain, divided by the RF test signal's output voltage. There are two primary paths for signals to traverse the circuit, neither of which are very good, indicating the circuit has excellent isolation properties. One potential path is for the test signal to leak across the Cdg of Q6 and Q5 without being attenuated by C8 at the common gate node. The ratio of C8 to Cdg can be made very favorable, on the order of 50 to 1 or more, such that very little signal can pass. The other mechanism, not drawn into FIG. 6, is for a signal to leak from the drains to sources of the two devices Q6 and Q4, and then from the sources to the drains of Q3 and Q5 before appearing at the other side. Since these leakage paths have very high impedance in most FET devices, very little current will flow across this path. Note that shunt feedback from the output drains of Q6 or Q5 to the gates of Q4 and Q3 respectively is not used precisely because high isolation is desired and applying shunt feedback will adversely affect isolation.

The high isolation of the present invention's output stage provides for excellent separation between reflected signals, now returning to the output, and the signal detector block.

These reflected signals occur when in-home cabling is of poor quality, or when terminations of coaxial distribution networks are not properly maintained. In other words, the signal detector's drive level is independent of the impedance presented to the output off the drain of Q5 in FIG. 4. In normal AGC operation, since the signal detector is not affected by impedance conditions on the output, the AGC network launches an appropriate amount of RF signal regardless of the impedance condition down the coaxial cable(s). The high isolation of the circuits in FIG. 6 and FIG. 4 provide excellent directivity; returning signals are not detected by the signal detector and no adjustment to RF output level is made by the AGC.

Biasing of the differential pairs in FIG. 4 is accomplished by placing a high impedance gate bias of 0 volts, and generating a reverse bias on the FETs of approximately ⅓ of the device pinch-off or about −0.3 v. The values of R9 and R10 then set the bias currents in the differential pairs. It is important to note the biasing inductors L9 and L10 in series with the biasing resistors R9 and R10. These inductors serve to increase the impedance seen from the sources of Q1, Q2, Q3, Q4 to ground, which has the desirable effect of improving the common mode rejection performance of the differential pair. Without the inductors L9 and L10, the remaining impedance connected to each source would be very small, since the values of R9 and R10 are quite small, being only large enough to set the bias current. Increased common mode rejection leads to improved circuit balance and better $2^{nd}$ order performance in the even that there are any small imbalances present in the circuit.

Because the drain of Q6 only has to drive the signal detector, it can provide a very high amount of drive compared with the prior art approach of FIG. 2, where the drive level into the signal detector has been attenuated by the directional coupler. Typical directional coupled port loss is 10 to 20 dB, so the present invention provides a significantly higher level signal to the signal detector, which makes the design easier and less costly. Increasing amounts of signal input will generate larger detected voltages within the signal detection circuitry, which will allow for lower cost analog components, such as operational amplifiers with loosened offset performance. The present invention also has a very high amount of signal detector directivity, which is the difference in response at the signal detector's output between the case of normal receiver operation and the case when the input light is turned off and only a returning signal of equal level as when a full reflection occurs in normal operation. Because of the high inherent isolation between the drains of Q5 and Q6, the present technique provides excellent directivity.

To maintain isolation, there is no shunt feedback connection between the drains of Q5 and Q6 and the corresponding gates of Q3 and Q4. This produces a high output impedance on the drains of Q5 and Q6, which can be reduced by adding R13 and R14 across biasing inductors L7 and L8 respectively. While these resistors directly reduce the gain and effective output linearity of the invention, the cascode topology with its inherently higher gain and linearity helps mitigate these losses.

In addition, R13 can be used to set the output impedance of the invention with excellent precision because the cascode topology otherwise has very high output impedance. Because the present invention has the ability to control the output impedance, signals that are reflected from RF distribution networks can be terminated, with the proper selection of R13. For most video systems R13 should be set to approximately 75 ohms. As a result, the signal power leaving the circuit is for all practical purposes only the original output signal power derived from the optical input current. Thus, there is no power present in the signal leaving the optical receiver from multiple reflections between the output amplifier and the RF distribution network.

Element values in the embodiment of FIG. 4 are shown in TABLE 1 below. Iatten is a variable current source whose values range between 100 uA and 15 mA.

TABLE 1

| Resistors | Value (ohms) | Capacitors | Value (pF) | Inductors | Value (nH) |
|---|---|---|---|---|---|
| R1 | 1000 | C1 | 470 | L1 | 15 |
| R2 | 1000 | C2 | 470 | L2 | 15 |
| R4 | 100 | C3 | 40 | L3 | 880 |
| R4 | 100 | C4 | 40 | L4 | 880 |
| R6 | 1000 | C5 | 470 | L5 | 880 |
| R7 | 1000 | C6 | 470 | L6 | 880 |
| R8 | 1000 | C7 | 4700 | L7 | 390 |
| R9 | 3 | C8 | 4700 | L8 | 390 |
| R10 | 3 | | | L9 | 880 |
| R11 | 5000 | | | L10 | 880 |
| R12 | 5000 | | | | |
| R13 | 75 | | | | |
| R14 | 75 | | | | |
| Rfb1 | 1000 | | | | |
| Rfb2 | 1000 | | | | |

Figure 5:
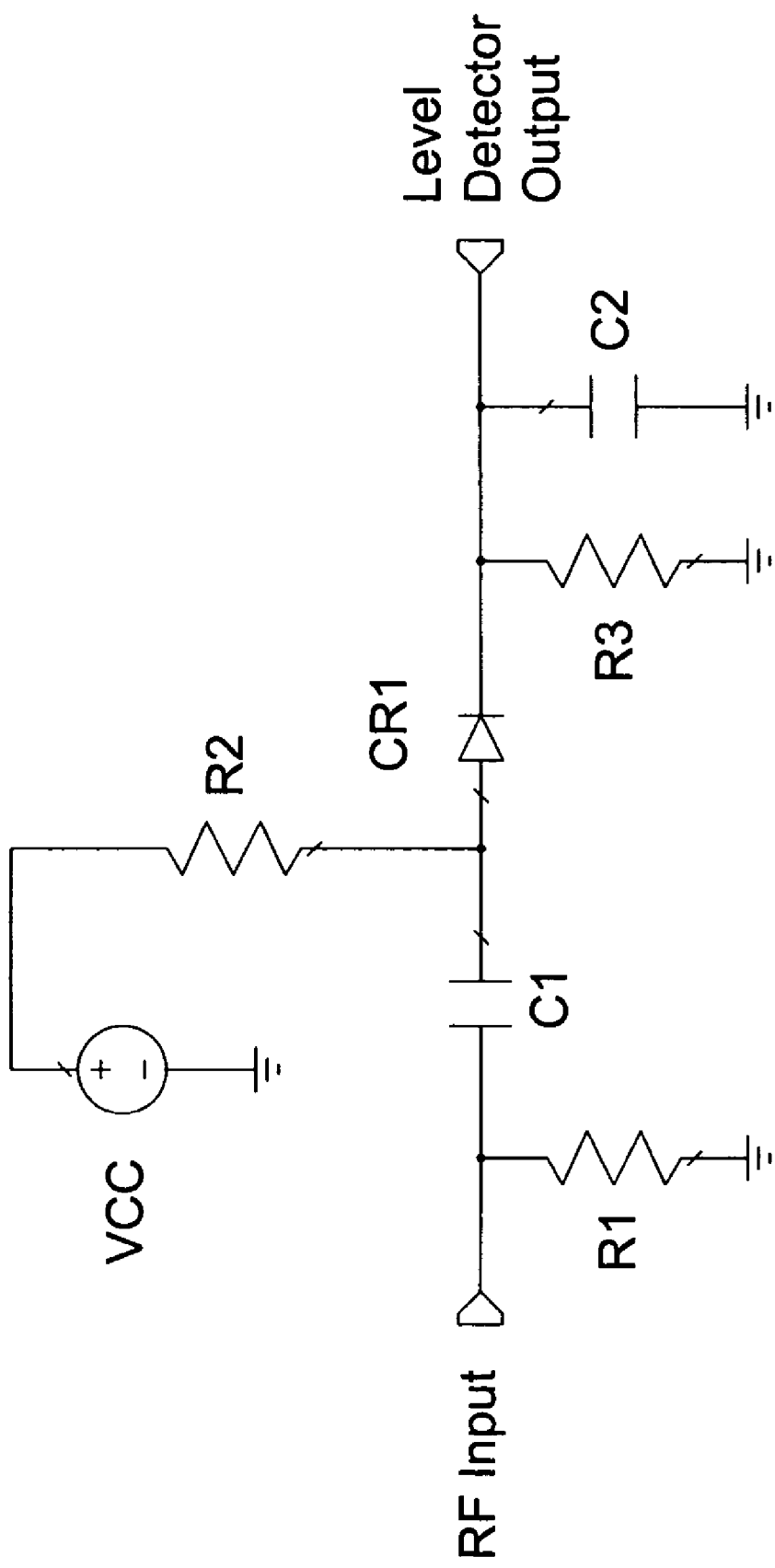
FIG. 5 is a schematic diagram of one embodiment of a signal detector shown in FIG. 3.

An embodiment of the signal detector circuit is shown in FIG. 5. The RF input is applied across R1, which terminates the signal in a fixed impedance. C1 provides AC coupling into the detector diode, CR1, which is biased to a very low DC current from VCC through R2. The diode used is manufactured by Agilent Technologies, part number HSMS-2865. This low DC current forward biases the detector diode, CR1, and produces a very small DC voltage across the R3/C2 filter network. As the RF input level increases, the AC voltage appearing across CR1 increases in such a way that the average current through CR1 increases related to the increase in RF signal level. Thus, the level detector output in FIG. 5 provides an indication of how much RF power is coming into the detector. The preferred values for the circuit in FIG. 5 are R1=75 ohms, R2=100 kohms, R3=1 kohm, C1=470 pF, and C2=470 pF.

Figure 7:
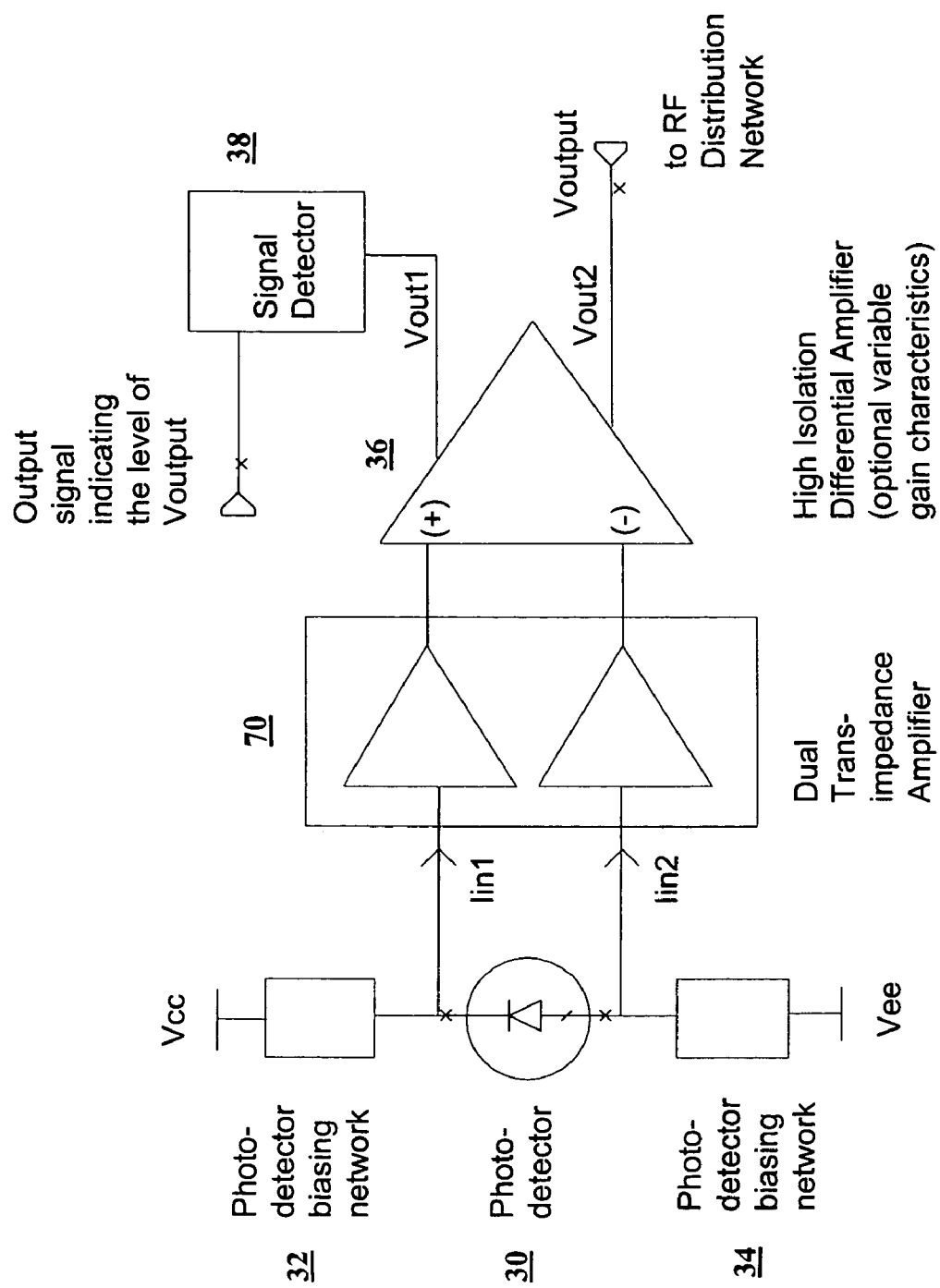
FIG. 7 is a block diagram of an alternative embodiment of the present invention.

An alternative embodiment of the present invention is shown in FIG. 7, where the input differential trans-impedance amplifier has been replaced with a dual trans-impedance amplifier. The dual trans-impedance amplifier may be two completely separate amplifiers, or it may be two separate amplifiers fabricated on the same integrated circuit for improved matching. In FIG. 7, bias is introduced to a photo-detector via a photo-detector biasing network, which may be constructed using inductors or resistors. A high impedance is sought between Vcc and the cathode and Vcc and the anode of the photo-detector, so as to direct as much photo-detector current into the trans-impedance amplifiers as possible to optimize signal-to-noise ratio. The photo-detector demodulates the incoming light and provides two current signals into the two respective inputs of the dual trans-impedance amplifier. These currents are 180 degrees out of phase with each other such that the outputs of the dual trans-impedance amplifier are also 180 degrees out of phase. These outputs are then coupled into two inputs of a differential amplifier which provides gain to boost the signal level. The differential amplifier has at least two outputs; one output drives the RF distribution network while the other drives a signal detector. The outputs do not need to have the same phase as each other, but they do need to have a high degree of isolation between each other to preserve the effective directivity of the signal detector. The differential amplifier may optionally have adjustable gain, useful in AGC circuits.

Figure 8:
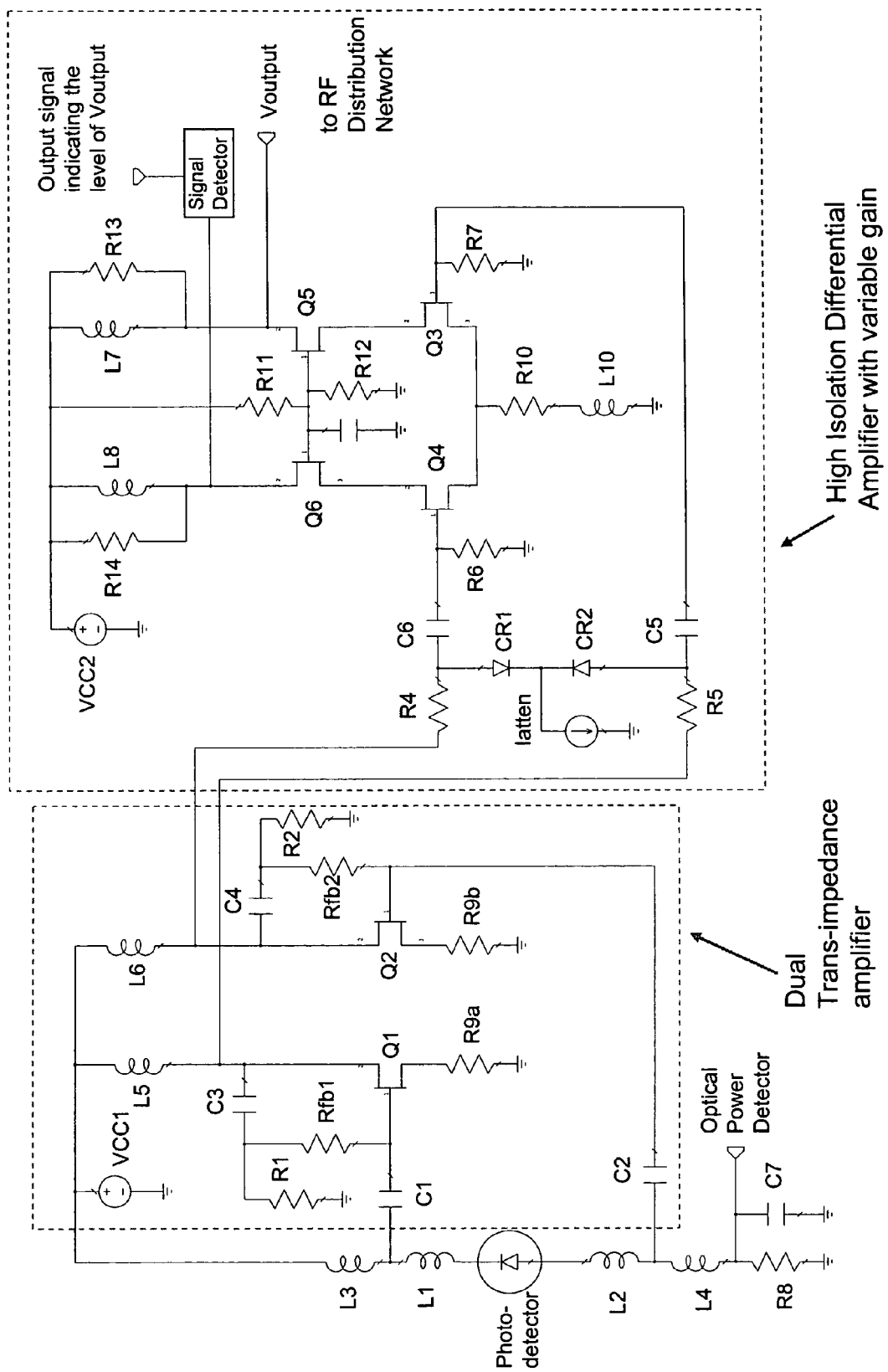
FIG. 8 is a schematic diagram showing one embodiment of the block diagram of FIG. 7.

An embodiment of the invention shown in FIG. 7 is shown in FIG. 8, where the differential trans-impedance amplifier has been replaced with a dual trans-impedance amplifier. The dual trans-impedance amplifier consists of two matched trans-impedance amplifiers. The circuit operates in much the same manner as that of FIG. 4, except Q1 and Q2 now form trans-impedance amplifiers that operate largely independent from each other. In other words, the dual trans-impedance amplifier has very poor common-mode rejection performance, as contrasted with the circuit of FIG. 4. The circuit in FIG. 8 may be easier to build than the circuit of FIG. 4, particularly when integrated circuit techniques are not available due to project cost and schedule restrictions. In that case, the dual trans-impedance amplifier in FIG. 8 may be constructed with two separately packed amplifiers or based upon separate transistors.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A circuit comprising:
    a photodetector having an anode and a cathode;
    a differential trans-impedance amplifier having two inputs and two outputs, wherein one input is connected to the photodetector anode, and a second input is connected to the photodetector cathode, the differential trans-impedance amplifier comprising:
        circuitry to electrically isolate the outputs of the trans-impedance amplifier, such that a change in loading conditions on a first output does not alter a signal level on a second output, and wherein an externally induced signal on a first output does not appear on the second output; and
    a signal detector connected to one output of the trans-impedance amplifier;
    wherein an output signal of the signal detector is an indication of an output power level of a signal leaving the circuit;
    wherein the circuitry to isolate the trans-impedance amplifier outputs comprises an output stage having a cascode topology to provide electrical isolation between the outputs.

2. The circuit of claim 1, wherein a photodetector biasing network is connected to the photodetector.

3. The circuit of claim 2, wherein trans-impedance in the trans-impedance amplifier is controlled by using feedback in a differential pair of transistors.

4. The circuit of claim 3, wherein the differential trans-impedance amplifier has variable gain.

5. The circuit of claim 2, wherein the signal detector detects a signal strength of a signal originally leaving the circuit.

6. The circuit of claim 2, wherein the amplifier comprises:
    a dual trans-impedance amplifier; and
    a differential output amplifier.

7. The circuit of claim 6, wherein the signal detector detects a signal strength of a signal originally leaving the circuit.

8. A method of detecting the output power level of an optical receiver, the method comprising:
    detecting an optical signal with a photodetector, the photodetector generating a first current and a second current;
    applying the first current to one input of a differential trans-impedance amplifier, the trans-impedance amplifier having a first output and a second output;
    applying the second current to a second input of an amplifier;
    electrically isolating the first and second outputs of the trans-impedance amplifier with a circuitry, such that a change in loading conditions on a first output does not alter a signal level on a second output, and wherein an externally induced signal on a first output does not appear on the second output; and
    applying an output of the amplifier to a signal detector;
    wherein an output signal of the signal detector is an indication of an output power level of the optical receiver;
    wherein the circuitry to isolate the trans-impedance amplifier outputs comprises an output stage having a cascode to topology to provide electrical isolation between the outputs.

9. The method of claim 8, wherein trans-impedance in the trans-impedance amplifier is controlled by using feedback in a differential pair of transistors.

10. The method of claim 9, wherein the signal detector detects a signal a signal strength of a signal originally leaving the optical receiver.

* * * * *